(12) United States Patent
Sato

(10) Patent No.: US 9,361,971 B2
(45) Date of Patent: Jun. 7, 2016

(54) SEMICONDUCTOR MODULE

(71) Applicant: Sony Corporation, Tokyo (JP)

(72) Inventor: Masahiro Sato, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/528,606

(22) Filed: Oct. 30, 2014

(65) Prior Publication Data
US 2015/0162070 A1 Jun. 11, 2015

(30) Foreign Application Priority Data

Dec. 6, 2013 (JP) .................................. 2013-253417

(51) Int. Cl.
G11C 7/22 (2006.01)
G11C 11/4076 (2006.01)
G11C 5/04 (2006.01)
G11C 5/06 (2006.01)
G11C 7/02 (2006.01)
G11C 11/4093 (2006.01)
G11C 29/02 (2006.01)
G11C 7/10 (2006.01)

(52) U.S. Cl.
CPC .............. *G11C 11/4076* (2013.01); *G11C 5/04* (2013.01); *G11C 5/063* (2013.01); *G11C 5/066* (2013.01); *G11C 7/02* (2013.01); *G11C 7/1057* (2013.01); *G11C 7/1066* (2013.01); *G11C 7/1072* (2013.01); *G11C 7/1084* (2013.01); *G11C 7/1093* (2013.01); *G11C 11/4093* (2013.01); *G11C 29/023* (2013.01); *G11C 29/028* (2013.01); *G11C 7/1051* (2013.01); *G11C 7/22* (2013.01); *H01L 2224/16225* (2013.01)

(58) Field of Classification Search
CPC ....... G11C 7/22; G11C 7/1066; G11C 7/1051
USPC ........................................................ 365/193
See application file for complete search history.

(56) References Cited

U.S. PATENT DOCUMENTS

2012/0201087 A1* 8/2012 Mizuno ................ H05K 1/0218
365/193

FOREIGN PATENT DOCUMENTS

JP 2007-213375 8/2007

* cited by examiner

*Primary Examiner* — Jason Lappas
(74) *Attorney, Agent, or Firm* — Michael Best & Friedrich LLP

(57) ABSTRACT

A semiconductor module includes a wiring layer for data signal lines on which all data signal lines transferring a data signal are wired, a wiring layer for strobe signal lines on which all strobe signal lines transferring a strobe signal are wired in a plane connected to the wiring layer for data signal lines through vias passing through the wiring layer for data signal lines, and a chip delaying the data signal with respect to the strobe signal.

10 Claims, 13 Drawing Sheets

FIG. 4
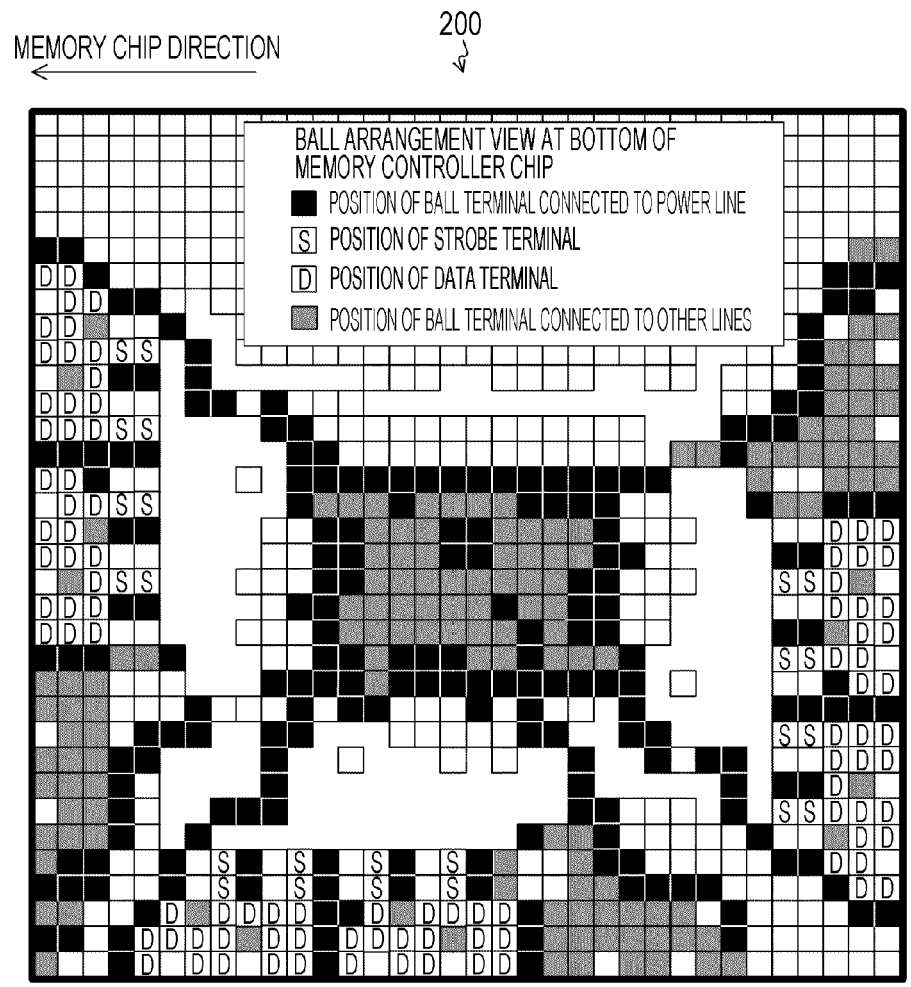
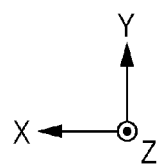

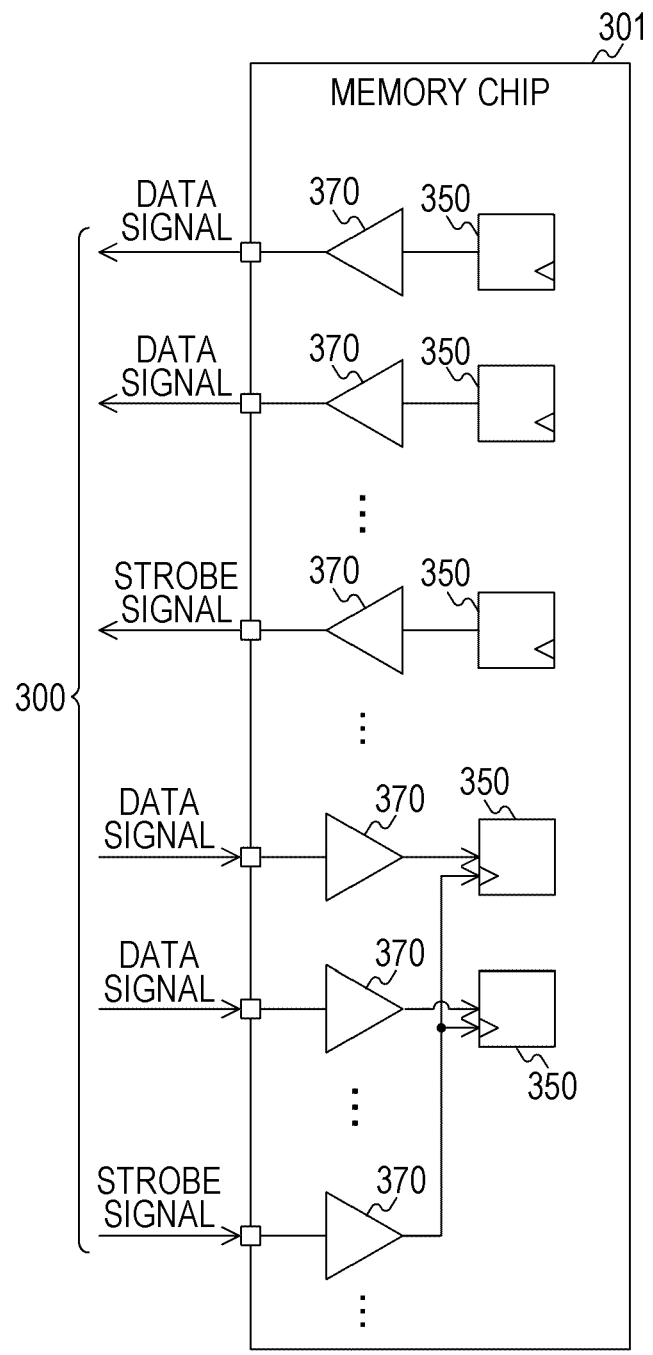

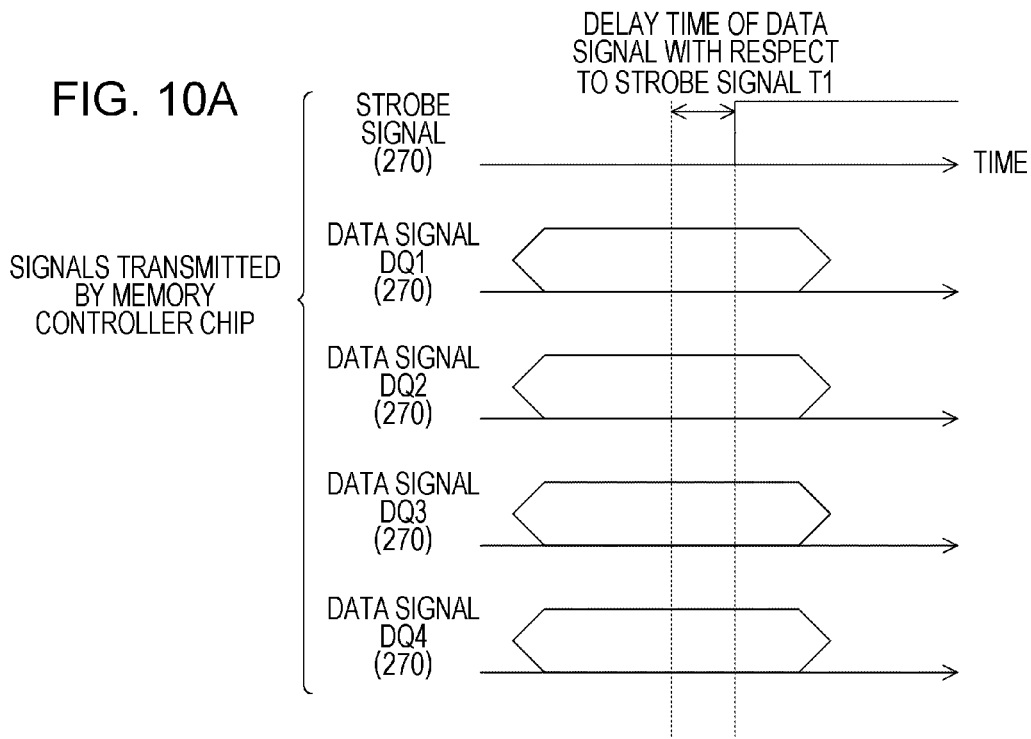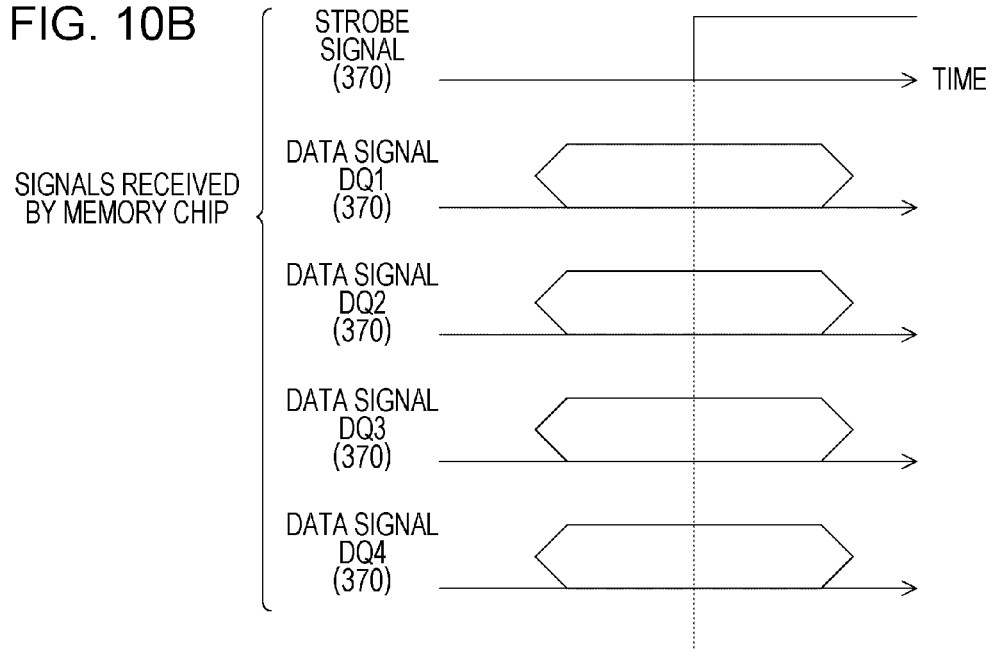

SIGNALS RECEIVED BY MEMORY CHIP BEFORE ADJUSTMENT OF DELAY TIME

SIGNALS RECEIVED BY MEMORY CHIP AFTER ADJUSTMENT OF DATA SIGNAL

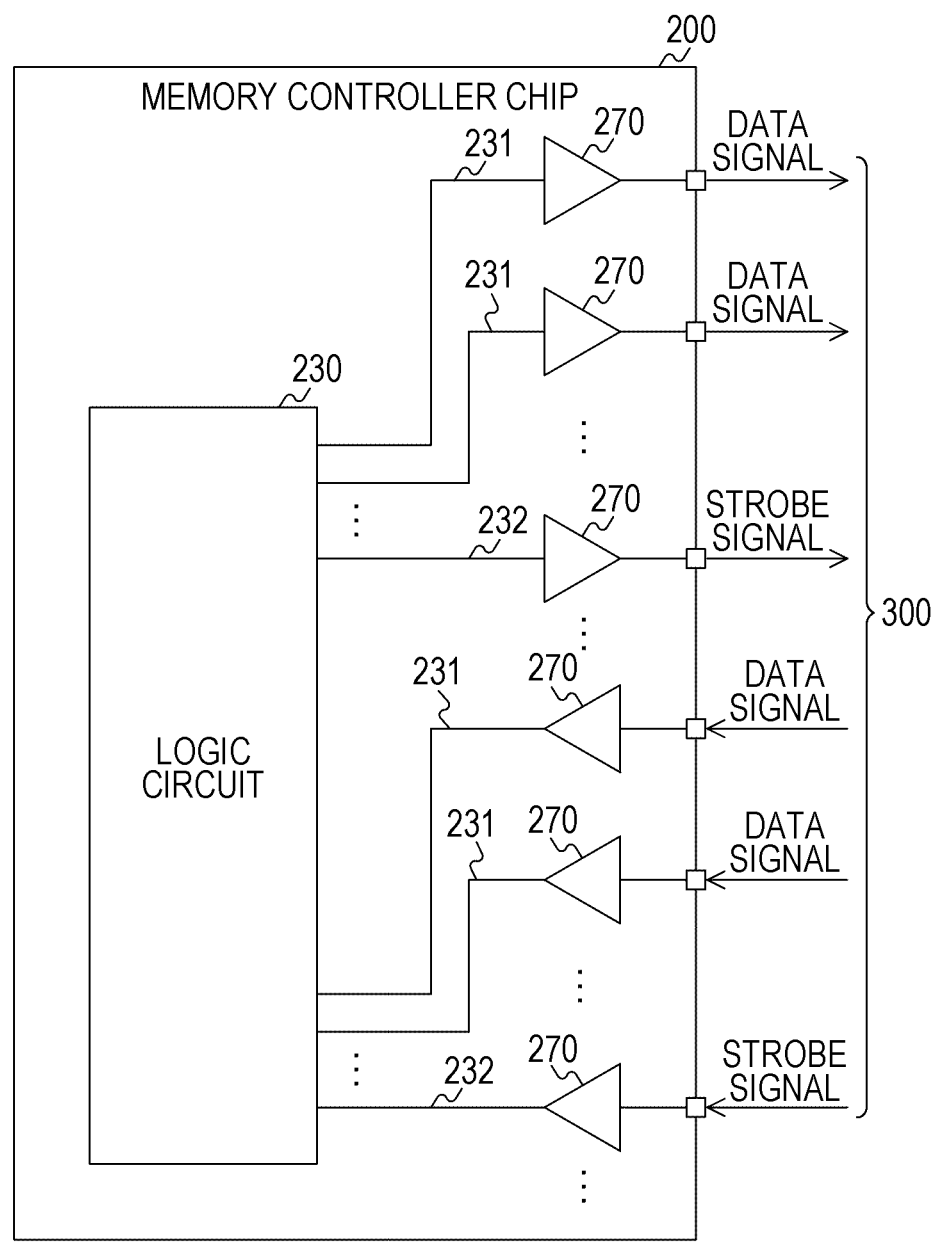

SEMICONDUCTOR MODULE

CROSS REFERENCE TO RELATED APPLICATIONS

This application claims the benefit of Japanese Priority Patent Application JP 2013-253417 filed Dec. 6, 2013, the entire contents of which are incorporated herein by reference.

BACKGROUND

The present technology relates to a semiconductor module. More particularly, the present technology relates to a semiconductor module in which data signal lines and strobe signal lines are wired.

In the related art, various types of semiconductor packages are used for the purpose of protecting a chip and the like in a semiconductor module. As type of semiconductor package, a Quad Flat Package (QFP) in which rectangular lead terminals protrude at four sides, a Ball Grid Array (BGA) package in which ball terminals of a ball shape are arrayed in a grid shape on a surface, and the like are known. Here, in general, the ball terminal is smaller than the lead terminal, and a density of the ball terminal can be set to be higher than that of the lead terminal. Therefore, the BGA package is often used when intending to reduce a mounting area.

When providing a memory chip such as a Double Data Rate Synchronous DRAM (DDR SDRAM) and the like, and a chip of a memory controller in the BGA package, data signal lines and strobe signal lines are wired between these chips. The data signal line is a signal line which transfers a data signal. The strobe signal line is a signal line which indicates a timing to capture the data signal at a receiving side and transfers a strobe signal. In the BGA package, when wiring all of the data signal lines and the strobe signal lines on a surface on which chips are disposed, the chips have to be disposed on the same surface. Thus, wiring becomes difficult as the number of data signal lines and the like is increased. Accordingly, the BGA package which wires the data signal lines and the strobe signal lines on a lower layer through vias passing through an upper layer by using a substrate of a plurality of layers as a substrate for a semiconductor package, and by disposing chips on these upper layers has been proposed (for example, refer to Japanese Patent No. 4662474).

SUMMARY

However, in the related art described above, it is difficult to manufacture a semiconductor module which is successfully operated at a low cost. This is because a via which is a factor of cost increase is provided in all of the data signal lines and the strobe signal lines in the BGA package, the number of vias is increased as the number of signal lines is increased, and thereby increasing cost. Specifically, when disposing the vias, in order to ensure a via land, and a necessary clearance from the via land, a wiring space is eliminated. As a result, an area of a substrate has to be enlarged, thereby increasing a cost of substrate. On the other hand, when reducing the number of vias and mixing a signal through the vias and a signal not through the vias, a difference in delay time between these signals occurs, and thereby there is a possibility that a semiconductor module is not successfully operated. Accordingly, it is difficult to manufacture a semiconductor module successfully operating at a low cost.

It is desirable to provide a low-cost semiconductor module which is successfully operated.

According to an embodiment of the present technology, there is provided a semiconductor module, including a wiring layer for data signal lines on which all data signal lines transferring a data signal are wired, a wiring layer for strobe signal lines on which all strobe signal lines transferring a strobe signal are wired in a plane connected to the wiring layer for data signal lines through vias passing through the wiring layer for data signal lines, and a chip delaying the data signal with respect to the strobe signal. Accordingly, all of the strobe signal lines are wired in a plane connected to the wiring layer for data signal lines through vias, and a data signal is delayed with respect to a strobe signal.

In the embodiment, the chip may include a data terminal provided along a side of the chip, and the data signal lines wired on the wiring layer for data signal lines may be connected to the data terminal provided in the chip. Accordingly, there is an effect that the data signal lines connected to the data terminal provided along a side of the chip are wired.

In the embodiment, the chip may further include a strobe terminal provided further inside than the data terminal, and the strobe signal lines wired on the wiring layer for strobe signal lines may be connected to the strobe terminal provided in the chip through the vias. Accordingly, there is an effect that a strobe line connected to the strobe terminal provided further inside than the data terminal is wired.

In the embodiment, the chip may further include a wiring area of a predetermined area in which the data signal lines are wired in a position adjacent to the data terminal along a side of the chip. Accordingly, there is an effect that data signal lines are wired in the wiring area.

In the embodiment, the chip may include a data wiring which transfers the data signal inside the chip; a strobe wiring whose wiring length is shorter than the data wiring, and which transfers the strobe signal inside the chip. Accordingly, there is an effect that a strobe signal is transferred through a strobe wiring whose wiring length is shorter than a data wiring.

According to the embodiment of the present technology, an excellent effect that it is possible to provide a low-cost semiconductor module which is successfully operated is obtained. The effects described herein are not necessarily limited, and may be any effect described in this disclosure.

BRIEF DESCRIPTION OF THE DRAWINGS

FIG. 4 is an example of a ball layout view at a bottom of the memory controller chip in the first embodiment;

FIG. 9 is a block diagram which shows a configuration example of a memory chip in the first embodiment;

FIGS. 10A and 10B are examples of a timing chart which shows transmission and reception timings of transmission data in the first embodiment;

FIG. 13 is a block diagram which shows a configuration example of a memory controller chip in a second embodiment.

DETAILED DESCRIPTION OF EMBODIMENTS

Hereinafter, modes for carrying out the present technology (hereinafter, referred to as embodiments) will be described. A description will proceed in a following order.

1. First embodiment (an example of delaying a data signal by wiring all strobe signal lines through vias)
2. Second embodiment (an example of delaying a data signal by shortening a strobe wiring and wiring all strobe signal lines through vias)

1. First Embodiment

Configuration Example of Semiconductor Module

Figure 1:
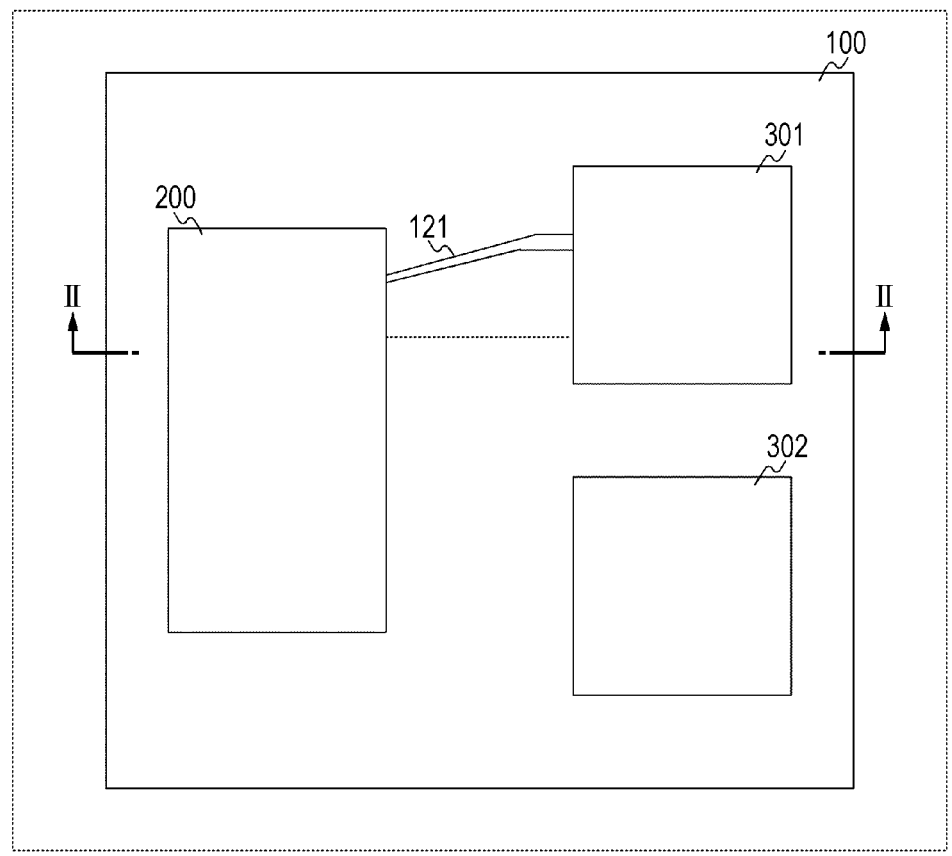
FIG. 1 is an example of a plan view of a semiconductor module in a first embodiment.

FIG. 1 is an example of a plan view of a semiconductor module in a first embodiment. This semiconductor module includes a wiring substrate 100, a memory controller chip 200, and memory chips 301 and 302.

The wiring substrate 100 is a substrate on which various types of signal lines are wired. The wired signal lines are data signal lines for transferring a data signal, strobe signal lines for transferring a strobe signal, and the like.

The memory controller chip 200 controls a memory chip. The memory chips 301 and 302 store data according to a control of the memory controller chip 200. For example, a DDR SDRAM is provided in these memory chips 301 and 302.

The memory controller chip 200, and the memory chips 301 and 302 are connected to the wiring substrate 100, respectively. Each chip connected exchanges signals such as data signals, strobe signals, or the like through a signal line wired in the wiring substrate 100. Hereinafter, any direction parallel to the wiring substrate 100 is referred to as an X direction, and a direction perpendicular to the X direction and parallel to the wiring substrate 100 is referred to as a Y direction. In addition, a direction perpendicular to the X direction and the Y direction is referred to as a Z direction.

Figure 2:
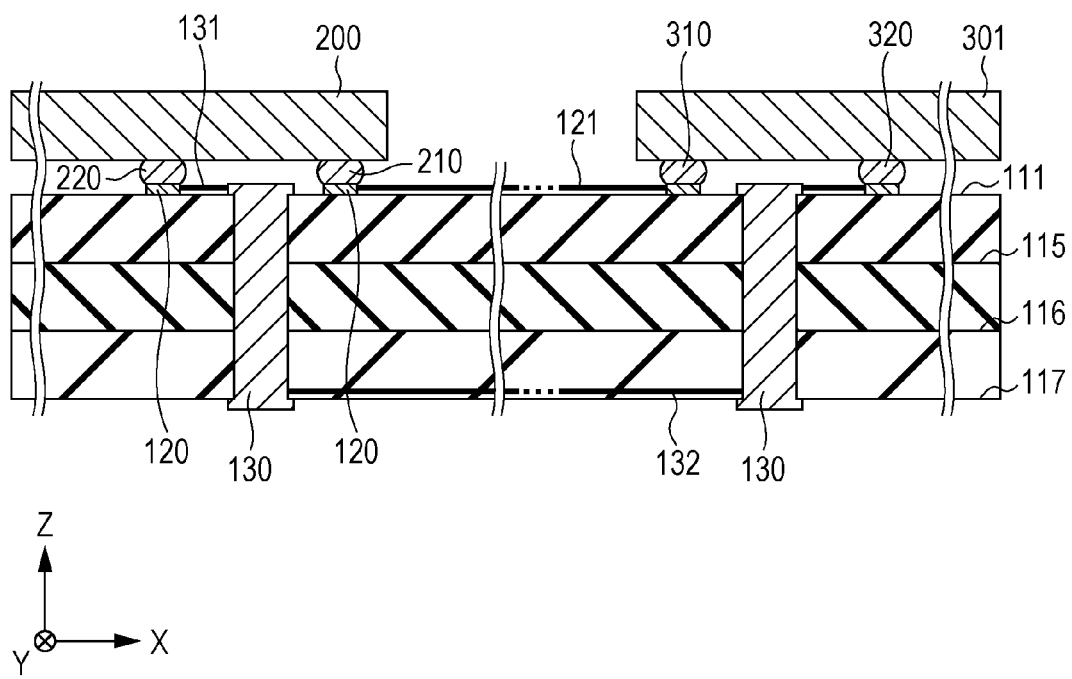
FIG. 2 is an example of a cross-sectional view of the semiconductor module in the first embodiment.

FIG. 2 is an example of a cross-sectional view of a semiconductor module which is cut in an axis of II-II of FIG. 1 in the first embodiment. In the semiconductor module, the wiring substrate 100 includes a plurality of layers such as layers 111, 115, 116, and 117. These layers have a plane perpendicular to the Z direction. In addition, the memory controller chip 200 sets a surface facing the layer 111 as a bottom surface and includes a plurality of ball terminals such as ball terminals 210 and 220 on the bottom surface. The memory chip 301 sets a surface facing the layer 111 as a bottom surface and includes a plurality of ball terminals such as ball terminals 310 and 320 on the bottom surface. A configuration of the memory chip 302 is the same as that of the memory chip 301.

The ball terminals 210 and 310 are ball-shaped terminals connected to data signal lines. In addition, the ball terminals 220 and 320 are ball-shaped terminals connected to strobe signal lines. The wiring substrate 100 (that is, semiconductor package) connected by these ball terminals is referred to as a BGA package described above.

The layer 111 includes a land 120 at each position corresponding to a ball terminal on a surface facing the memory controller chip 200 and the memory chip 301. As the land 120, a circular or square copper foil and the like are used. These lands 120 are connected to each of the ball terminals 210, 220, 310, and 320 by reflow processing and the like. Here, reflow processing is processing of melting a solder by printing a solder paste on a substrate, placing a chip thereon and applying heat thereto.

In addition, all data signal lines 121 are wired between a land 120 corresponding to the ball terminal 210 and a land 120 corresponding to the ball terminal 310 in the layer 111.

Moreover, the layers 111, 115, 116, and 117 are connected to each other by a plurality of vias 130 passing through these layers. As the vias 130, for example, through vias or build-up vias are used. In the layer 111, all strobe signal lines 131 are wired between the lands 120 corresponding to the ball terminals 220 and 320 and the vias 130. Then, in the layer 117, all strobe signal lines 132 are wired between these vias 130. The strobe signals are transferred through the vias 130 and the strobe signal lines 131 and 132.

A layer 111 is an example of a wiring layer for data signal lines described in embodiments, and the layer 117 is an example of a wiring layer for strobe signal lines described in embodiments.

As described above, a strobe signal is transferred through the via 130; however, a data signal is transferred not through the via 130. Therefore, the strobe signal is delayed with respect to the data signal, and a difference (skew) of delay time between respective signals occurs. As described above, since the strobe signal indicates a timing at which a receiving side captures the received data signal, if the skew is large, there is a possibility of a fail in capturing data signals received by each chip.

Therefore, the memory controller chip 200 adjusts the skew, and delays the data signal with respect to the strobe signal. By delaying the data signal, even if the strobe signal is delayed, a difference of delay time between the data signal the strobe signal becomes small. Specifically, when transmitting a data signal to the memory chip 301 and the like, the memory controller chip 200 delays data signals with respect to strobe signals and transmits these signals. On the other hand, when receiving a data signal from the memory chip 301 and the like, the memory controller chip 200 delays data signals with respect to received strobe signals inside, and captures and processes these signals.

Figure 3:
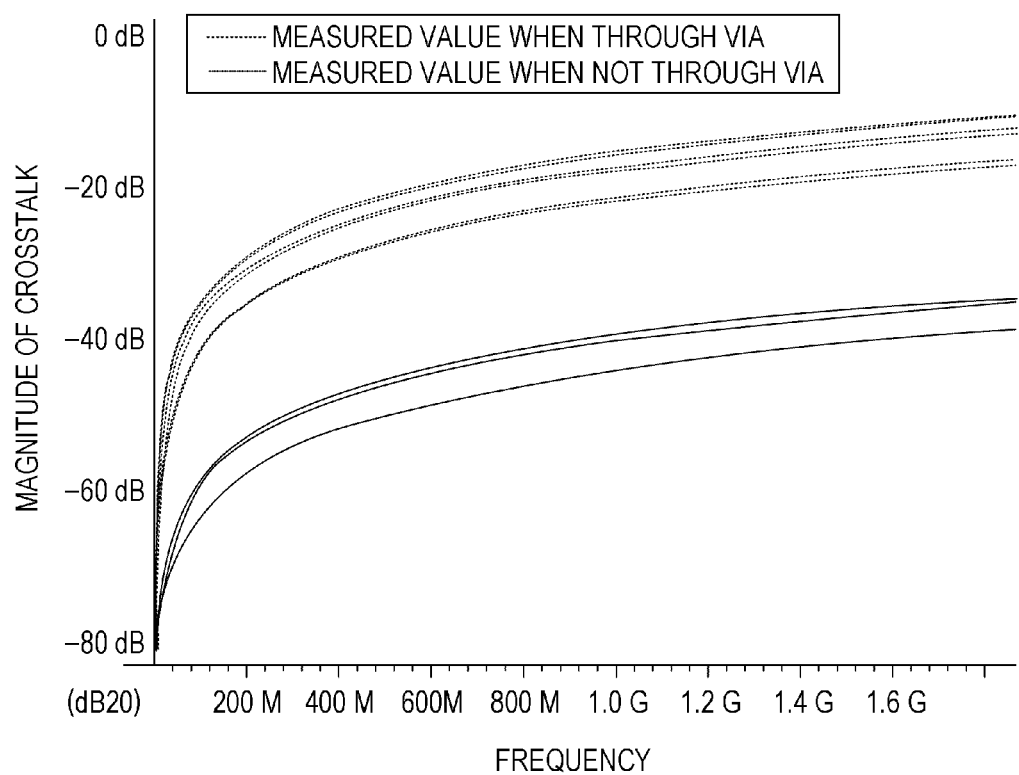
FIG. 3 is an example of a graph which shows a measured value of crosstalk in the first embodiment.

FIG. 3 is an example of a graph which shows a measured value of cross talk in the first embodiment. A vertical axis in the figure indicates a magnitude of cross talk, and a unit is, for example, a decibel (dB). Moreover, a horizontal axis in the figure indicates a frequency of a signal to be transferred, and a unit is, for example, a Hertz (Hz). Moreover, a solid curved line in the figure indicates a measured value of cross talk when a signal is transferred not through the vias 130. On the other hand, a dotted curved line indicates a measured value of cross talk when a signal is transferred through the vias 130.

As shown in FIG. 3, cross talk tends to be increased more when transferring signals through the vias 130 compared to when transmitting signals not through the vias 130. The increase in cross talk is because a waveform of a signal is disturbed due to a capacitive coupling of the vias 130 and the like. It is possible to reduce cross talk of a data signal by transferring data signals not through the vias 130. On the other hand, since the strobe signal is transferred through the vias 130, the cross talk is increased. However, the number of strobe signal lines is less than the number of data signal lines, and thereby it is possible to easily reduce the cross talk by measures such as providing a shield.

FIG. 4 is an example of a ball layout view at a bottom of the memory controller chip 200 according to the first embodiment. The ball layout view is a diagram which divides a plane of a chip into a plurality of rectangular areas and shows in which of these areas a ball terminal is disposed. In the figure, a black area is an area in which a ball terminal connected to a power line is disposed, and an area described in "S" is an area in which a strobe terminal is disposed. In addition, an area described in "D" is an area in which a data terminal is disposed, and a gray area indicates an area in which a ball terminal connected to the other signal lines (mask signal line, clock signal line, and the like) are disposed. A bold line indicates sides of the memory controller chip 200.

As shown in FIG. 4, a ball terminal (hereinafter, referred to as "data terminal") which connects data signal lines is provided along a side of the memory controller chip 200. By providing the data terminal along the side, it becomes easy to draw data signal lines outside the memory controller chip 200.

In addition, the ball terminal (hereinafter, referred to as "strobe terminal") which connects strobe signal lines is provided further inside than a data terminal on a bottom surface of the memory controller chip 200. By providing the strobe terminal further inside than the data terminal, it is not necessary to draw the data signal lines by avoiding the strobe terminal. Therefore, it is possible to easily perform wiring design of the data signal lines.

Moreover, a wiring area of a predetermined area for wiring the data signal lines is provided at a position adjacent to the data terminal along a side of the memory controller chip 200. In the wiring area, the ball terminal is not provided. By providing such a wiring area, it is not necessary to draw the data signal lines through a space between data terminals. Therefore, the wiring design becomes easier.

Example of Ball Layout

Figure 5:
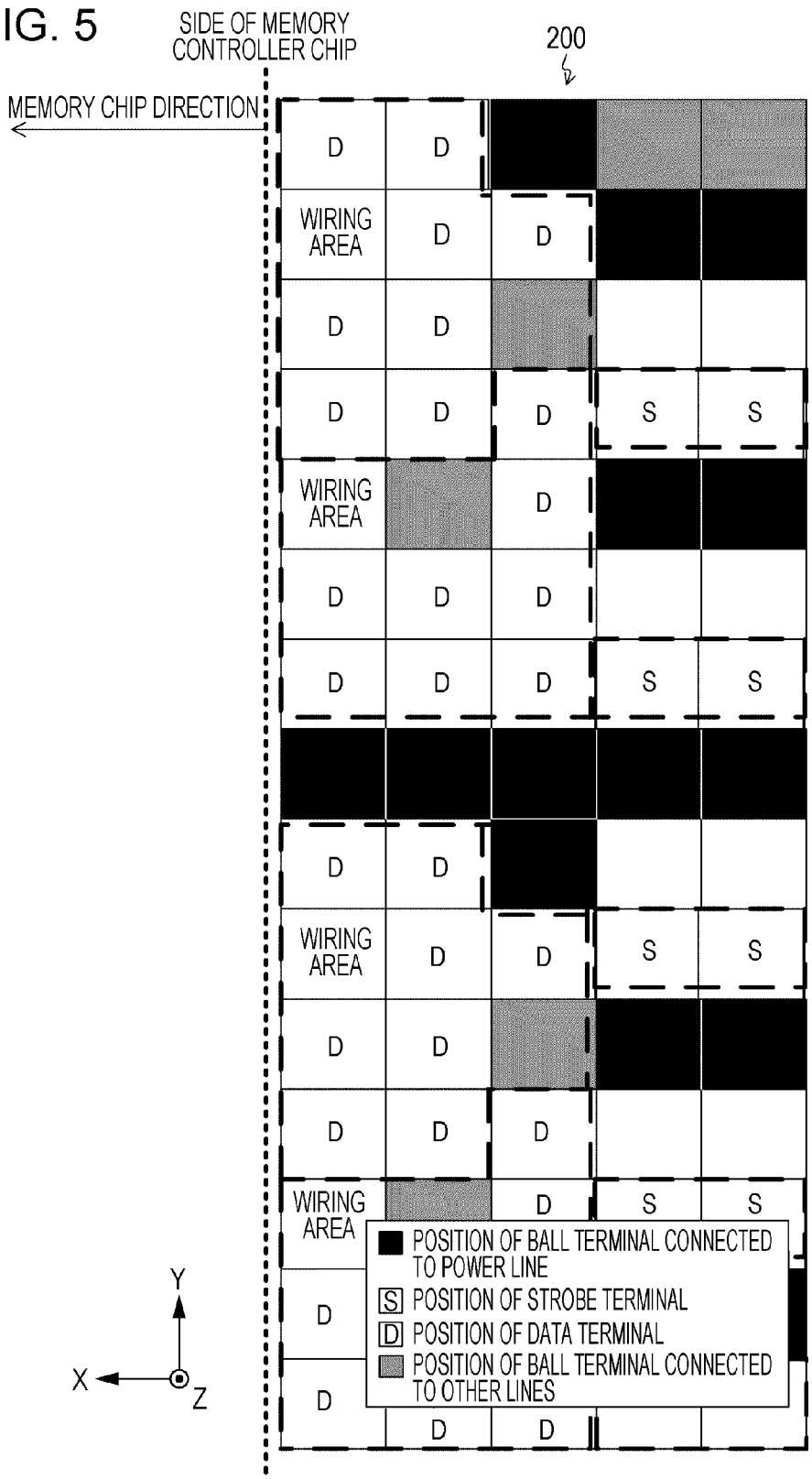
FIG. 5 is an enlarged view of a portion of the ball layout view at a bottom of the memory controller chip in the first embodiment.

FIG. 5 is an enlarged view of a portion of the ball layout view at a bottom of the memory controller chip 200 in the first embodiment. In the figure, when transferring one byte (eight bits) data by eight data signal lines, eight data terminals surrounded by a dotted line is a terminal connected by these data signal lines. Moreover, two strobe terminals surrounded by a dotted line are terminals connected by two strobe signal lines which transfer one strobe signal in a differential method.

As shown in FIG. 5, data terminals are arrayed over three columns along the side of the memory controller chip 200. Among the three columns, a column which is closest to the sides is set to be a first column, and wiring areas surrounded by the side and data terminals are provided in the first column. The data signal lines connected to second and third columns of data terminals are drawn to outside the memory controller chip 200 through the wiring areas in the first column. In addition, a strobe terminal is provided further inside than these data terminals.

Figure 6:
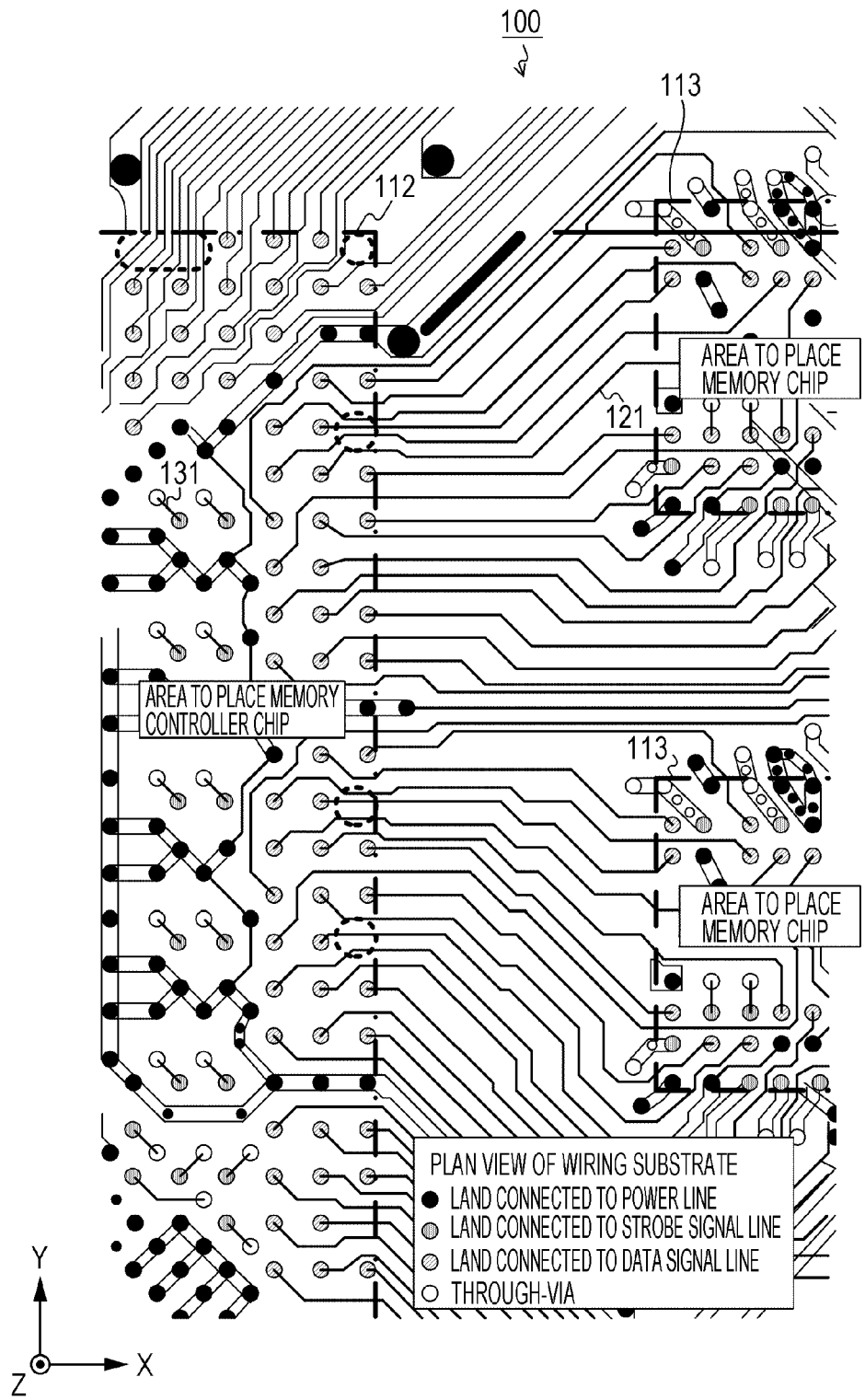
FIG. 6 is an example of a plan view of a wiring substrate in the first embodiment.

FIG. 6 is an example of a plan view of a wiring substrate 100 in the first embodiment. In the figure, a black circle is the land 120 connected to a power line. A circle with a vertical line drawn is a land 120 connected to the strobe signal lines 131, and a circle with a diagonal line drawn is a land 120 connected to the data signal lines 121.

Moreover, an area 112 in which the memory controller chip 200 is disposed and an area 113 in which the memory chips 301 and 302 are disposed are provided in the wiring substrate 100. In these areas, the lands 120 are provided at a position corresponding to each ball terminal. In addition, a region surrounded by a dotted line indicates a wiring area. Data signal lines are wired through the wiring area.

Three columns of data terminals are arrayed along a side of the memory controller chip 200. A data signal line taken from a second column of data terminal is wired through a wiring area. A portion of a signal line taken from a third column of data terminal is wired through the wiring area, and the rest is wired by bypassing an adjacent data terminal. When performing the bypass, data signal lines are wired in a direction at an angle larger than 90 degrees with respect to a direction to the memory chip 301.

Configuration Example of Memory Controller Chip

Figure 7:
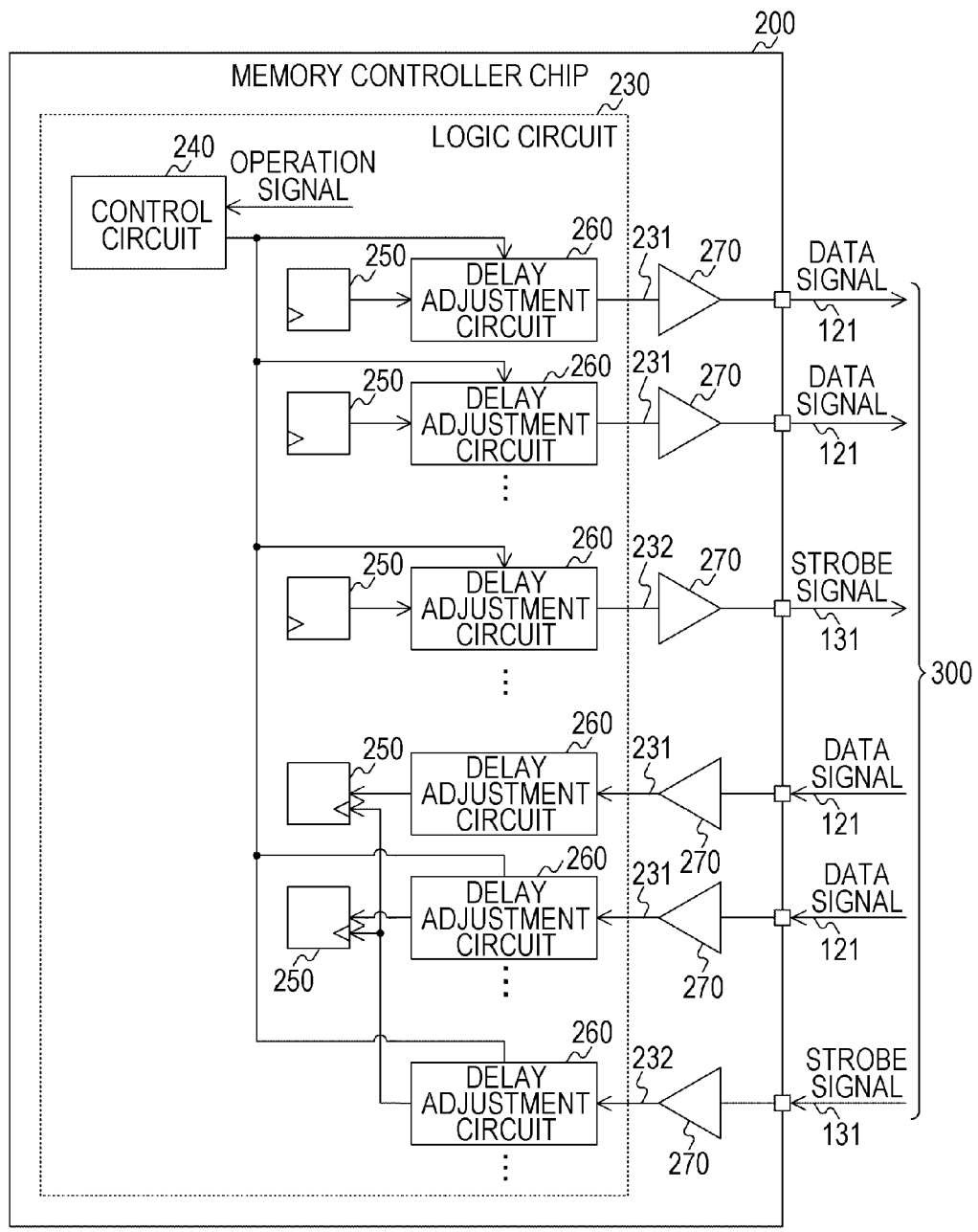
FIG. 7 is a block diagram which shows a configuration example of the memory controller chip in the first embodiment.

FIG. 7 is a block diagram which shows a configuration example of the memory controller chip 200 in the first embodiment. The memory controller chip 200 includes a logic circuit 230 and a plurality of buffers 270. The logic circuit 230 includes a control circuit 240, a plurality of flip-flops 250, and a plurality of delay adjustment circuits 260. The flip-flop 250, the delay adjustment circuit 260, and the buffer 270 are provided for each of the data terminal and the strobe terminal.

The flip-flop 250 holds a signal (data signal or strobe signal) transmitted to the memory chip 301 and the like, or a signal received from the memory chip 301 and the like. The transmitted signal is supplied to the corresponding delay adjustment circuit 260 from the flip-flop 250.

On the other hand, the received data signal is supplied to a corresponding data input terminal of the flip-flop 250 from the delay adjustment circuit 260. In addition, the received strobe signal is supplied to each clock terminal of the flip-flop 250 which holds the received data signal from the delay adjustment circuit 260. When a strobe signal rises, the flip-flop 250 captures and holds a data signal from the delay adjustment circuit 260. The flip-flop 250 captures the data signal in synchronization with a rise of the strobe signal; however, the flip-flop 250 may capture the data signal in synchronization with a falling of the strobe signal.

The delay adjustment circuit 260 adjusts delay time of a data signal or a strobe signal. Delay time is set in advance in each of the delay adjustment circuits 260. The delay adjustment circuit 260 delays a data signal or a strobe signal as much as the set delay time, and outputs the delayed signal. A signal transmitted to the memory chip 301 and the like is supplied to a corresponding delay adjustment circuit 260 from the flip-flop 250. Then, the delay adjustment circuit 260 delays the supplied signal and supplies the delayed signal to a corresponding buffer 270 through the data wiring 231 or the strobe wiring 232.

Here, the data wiring 231 is a wiring which transfers a data signal in the memory controller chip 200, and the strobe wiring 232 is a wiring which transfers a strobe signal in the memory controller chip 200. These data wiring 231 and strobe wiring 232 are the same in length.

On the other hand, a signal received from the memory chip 301 and the like is supplied to the corresponding delay adjustment circuit 260 through the data wiring 231 or the strobe wiring 232 from the buffer 270. Then, the delay adjustment circuit 260 delays the supplied signal, and supplies the delayed signal to a corresponding flip-flop 250.

Here, the delay adjustment circuit 260 delays a data signal to be transmitted with respect to a strobe signal to be transmitted, and outputs the delayed data signal to the buffer 270. In addition, the delay adjustment circuit 260 delays a received data signal with respect to a received strobe signal, and outputs the delayed data signal to the flip-flop 250. This is because the data signal is transferred not through the via 130 while the strobe signal is transferred through the via 130 and takes a long delay time.

The buffer 270 adjusts a waveform or a voltage by transmitting or receiving a data signal or a strobe signal. The data signal transmitted to the memory chip 301 and the like is supplied to a corresponding buffer 270 from the delay adjustment circuit 260, and the buffer 270 transmits an adjusted signal to the memory chip 301 and the like. In addition, the buffer 270 which receives data from the memory chip 301 adjusts a waveform and the like of the signal, and supplies the result to a corresponding delay adjustment circuit 260.

The delay adjustment circuit 260 is provided in each of the data terminal and the strobe terminal; however, the embodiment is not limited to this configuration. For example, the memory controller chip 200 delays a data signal to be transmitted, but does not delay a strobe signal to be transmitted. In this case, it is not necessary to provide the delay adjustment circuit 260 corresponding to the strobe signal.

Configuration Example of Delay Adjustment Circuit

Figure 8:
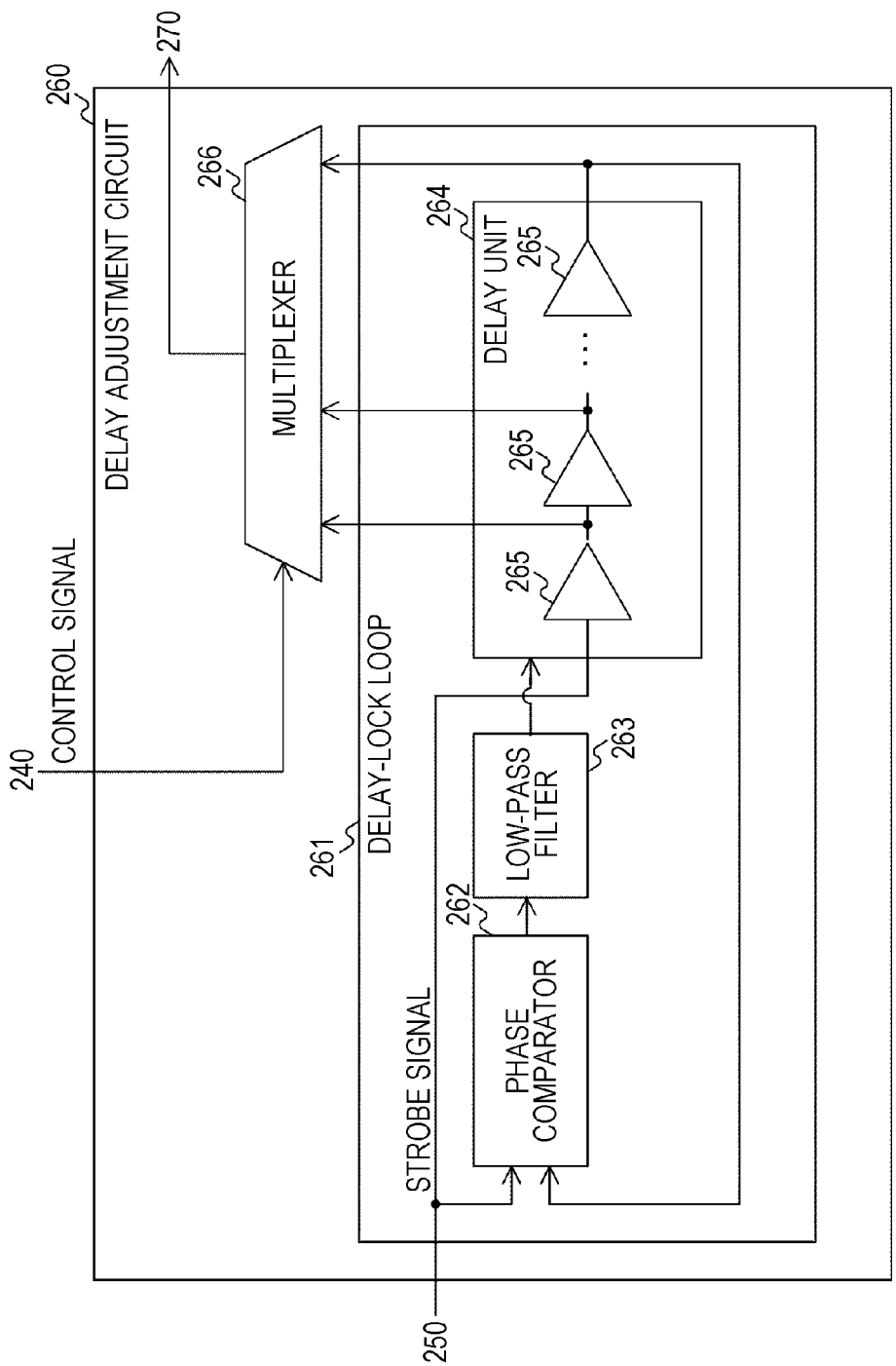
FIG. 8 is a block diagram which shows a configuration example of a delay adjustment circuit in the first embodiment.

FIG. 8 is a block diagram which shows a configuration example of the delay adjustment circuit 260 in the first embodiment. The delay adjustment circuit 260 includes a delay lock loop 261 and a multiplexer 266. The delay lock loop 261 includes a phase comparator 262, a low-pass filter 263, and a delay unit 264.

A phase comparator 262 compares a phase of an input signal (data signal or strobe signal) input to the delay adjustment circuit 260 with a phase of a feedback signal fed back from the delay unit 264. The phase comparator 262 supplies a voltage signal which shows a phase difference between these signals to the low-pass filter 263.

The low-pass filter 263 allows a frequency component less than a predetermined cut-off frequency to be passed through in a voltage signal from the phase comparator 262.

From an input signal, the delay unit 264 generates a plurality of output signals each having different delay time for the input signal. For example, the delay unit 264 includes a plurality of stages of delay elements 265 connected in series. Each of the delay elements 265 generates an output signal synchronized with an input signal based on a voltage signal. An input signal is input to an initial stage of the delay elements 265, and each stage of the delay elements 265 sets a signal which delays an input signal as much as a fixed delay time as an output signal, and supplies the output signal to a last stage of the delay elements 265 and a multiplexer 266. The last stage of the delay elements 265 supplies the delayed signal to the multiplexer 266 as an output signal, and allows the delayed signal to be fed back to the phase comparator 262 as a feedback signal.

The multiplexer 266 selects any one of a plurality of output signals according to a control of the control circuit 240 and outputs the selected output signal.

Configuration Example of Memory Chip

FIG. 9 is a block diagram which shows a configuration example of a memory chip 301 in the first embodiment. The memory chip 301 includes a plurality of buffers 370 and a plurality of flip-flops 350. Configurations of the buffer 370 and the flip-flop 350 are the same as configurations of the buffer 270 and the flip-flop 250 in the memory controller chip 200.

FIGS. 10A and 10B are examples of a timing chart which shows transmission and reception timings of transmission data in the first embodiment. "a" in the figure is an example of a timing chart which shows a transmission timing of a signal transmitted by the memory controller chip 200. The memory controller chip 200 delays a data signal as much as delay time T1 with respect to a strobe signal, and transmits the delayed data signal and the strobe signal from the buffer 270.

"b" in FIGS. 10A and 10B is an example of a timing chart which shows a reception timing of a signal received by the buffer 370 in the memory chip 301. Since a strobe signal in the wiring substrate 100 is transferred through the vias 130, the strobe signal is delayed as much as delay time T1 with respect to a data signal. However, since the data signal with respect to the strobe signal is delayed as much as delay time T1 and transmitted, there is almost no difference in delay time between the data signal and the strobe signal which are received. Accordingly, even if a difference in delay time between the data signal and the strobe signal in the wiring substrate 100 occurs, the memory chip 301 can successfully capture the data signal.

Figure 11A:
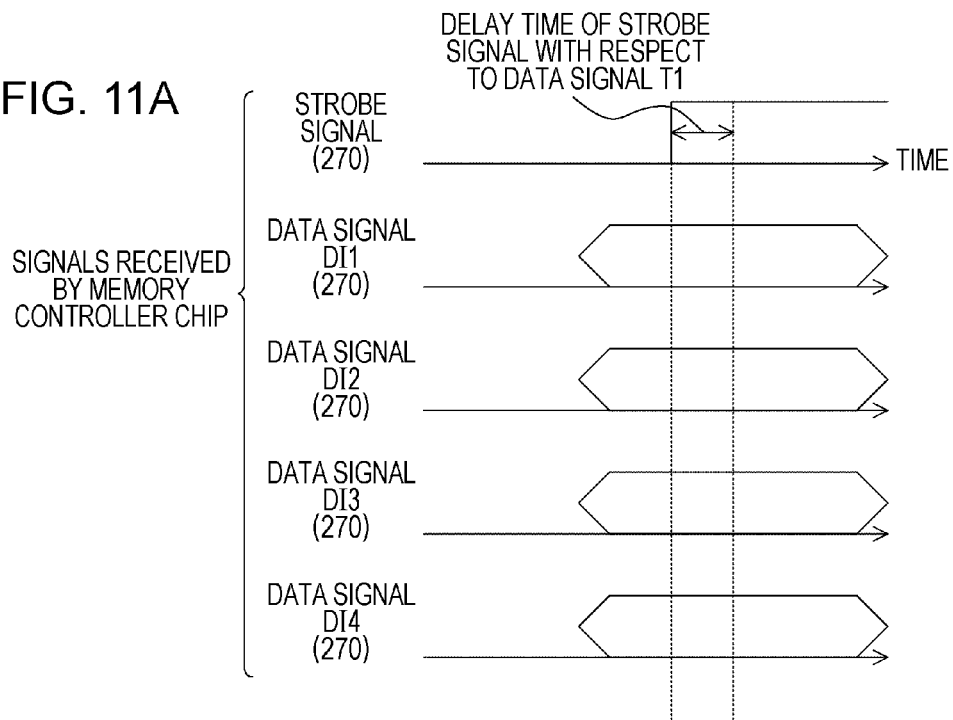
FIGS. 11A and 11B are examples of the timing chart which shows transmission and reception timing of reception data in the first embodiment.
Figure 11B:
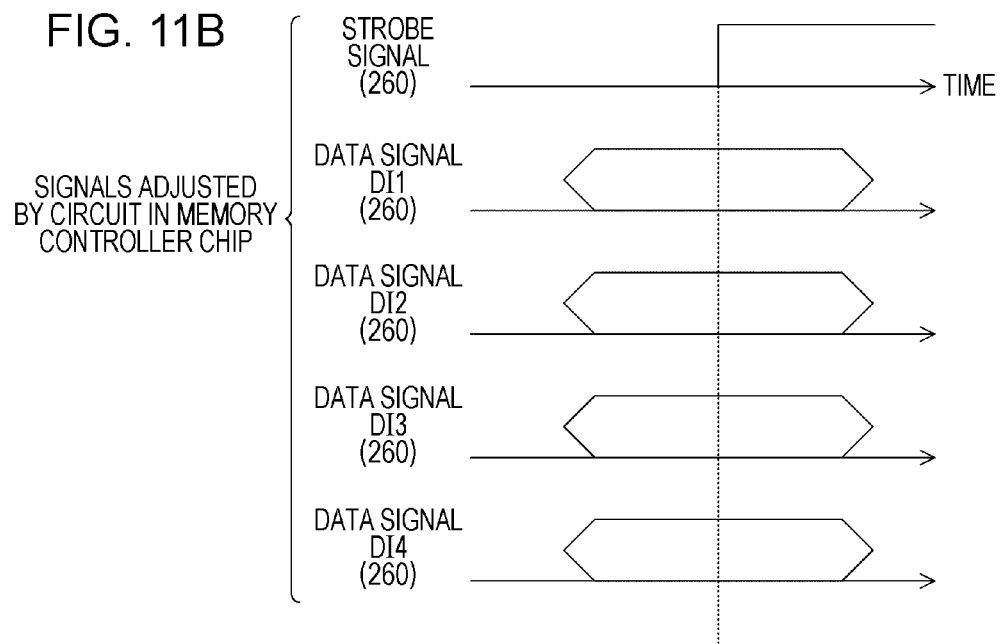

FIGS. 11A and 11B are examples of the timing chart which shows transmission and reception timing of reception data in the first embodiment. "a" in the figure is an example of a timing chart which shows a reception timing of a signal received by the memory controller chip 200. Since a strobe signal is transferred through the vias 130, the strobe signal is delayed as much as delay time T1 with respect to a data signal and received.

"b" in FIGS. 11A and 11B is an example of a timing chart which shows an output timing of a signal whose delay time is adjusted by the delay adjustment circuit 260 in the memory controller chip 200. The delay adjustment circuit 260 delays a data signal as much as delay time T1 with respect to a strobe signal. Accordingly, there is almost no difference in delay time between the data signal and the strobe signal, and the memory controller chip 200 can successfully capture the data signal.

Since it is difficult to have respective wiring lengths of the data signal lines completely in accord, respective delay time of data signals are not limited to being same. However, in FIGS. 10A to 11B, for convenience of description, description is provided with an assumption that respective delay time of data signals are the same as each other.

Figure 12A:
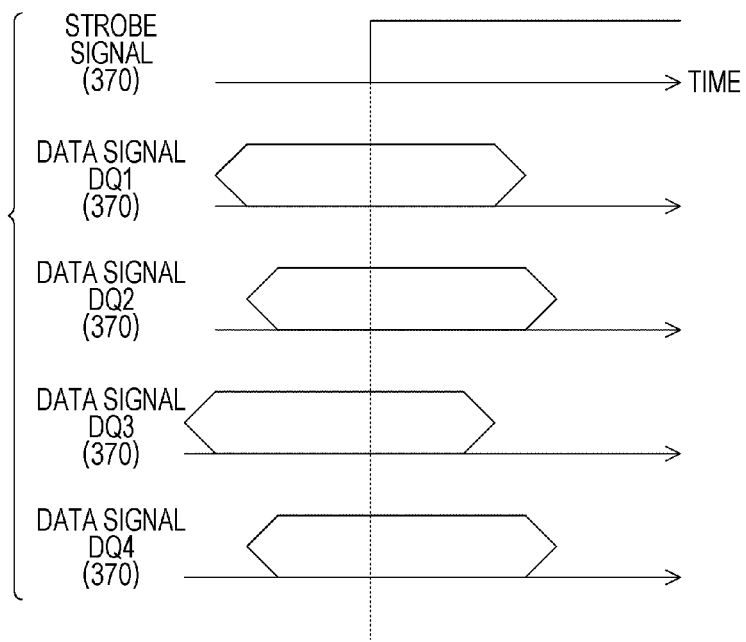
FIGS. 12A and 12B are examples of the timing chart which shows transmission and reception timing of data before a delay time adjustment in the first embodiment.
Figure 12B:
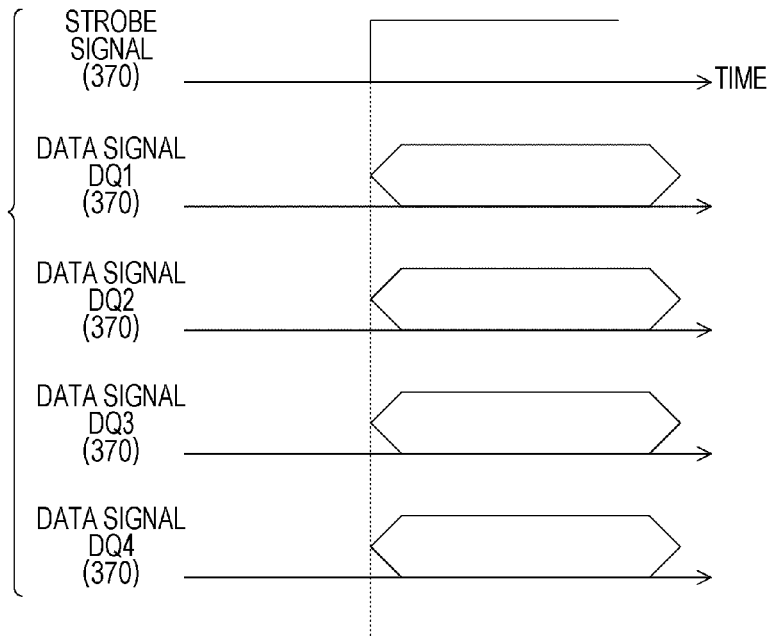

FIGS. 12A and 12B are examples of a timing chart which shows a transmission and reception timing of data before delay time is adjusted in the first embodiment. "a" in the figure is an example of a timing chart which shows a reception timing of a signal received by the memory chip 301 before adjustment of delay time. Before the adjustment, delay time of data signals is not in accord, and each delay time between a data signal and a strobe signal is also not in accord. An operator gets these delay times in accord by firstly adjusting respective delay time of data signals before a shipment of goods and the like.

"b" in FIGS. 12A and 12B is an example of a timing chart which shows a reception timing of a signal received by the memory chip 301 after adjusting delay time of a data signal. By an adjustment of delay time, delay time of data signals is in accord; however, a strobe signal is delayed with respect to the data signals. This is because the strobe signal is transferred through the via 130. An operator adjusts delay time of the data signals and the strobe signal and gets delay time of these signals in accord. As a result, as illustrated in FIGS. 10A to 11B, a difference in delay time between the data signals and the strobe signal is almost eliminated, and a chip can successfully capture a data signal.

As described above, according to the first embodiment of the present technology, since the memory controller chip delays a data signal with respect to a strobe signal by wiring all strobe signal lines through via, it is possible to successfully operate a semiconductor module. In addition, since the via is not provided for the data signal, cost is reduced. Accordingly, it is possible to provide a low-cost semiconductor module which is successfully operated.

2. Second Embodiment

In the first embodiment, there is no difference in a wiring length of wirings in the memory controller chip 200; however, it is desirable that a wiring length of the strobe wiring 232 is set to be short. By setting the wiring length to be short, it is possible to reduce wiring capacitance and to decrease cross talk. The memory controller chip 200 of a second embodiment is different from that of the first embodiment in that the wiring length of the strobe wiring 232 is set to be the shortest.

FIG. 13 is a block diagram which shows a configuration example of a memory controller chip in the second embodiment. In the memory controller chip 200 of the second embodiment, the wiring length of the strobe wiring 232 is shorter than any data wiring 231, and is the shortest.

By setting the strobe wiring 232 to be the shortest, it is possible to suppress the deterioration of a skew rate of the strobe signal affecting a setup and hold margin, and thereby an increase of jitter is suppressed. Moreover, by setting the strobe wiring 232 to be the shortest, it is possible to decrease a sum of wiring lengths of all wirings rather than to make wiring lengths of the data wiring 231 and the strobe wiring 232 the same as each other. Accordingly, an area of the memory controller chip 200 is decreased, and the cost is also reduced.

As described above, according to the first embodiment of the present technology, since a wiring length of the strobe wiring is shorter than a wiring length of the data wiring, it is possible to improve signal quality of the strobe signal.

The above-described embodiments are intended only to show an example for embodying the present technology, and the matters in the embodiments correspond to the disclosure-specifying matters in the claims, respectively. In the same manner, the disclosure-specifying matters in the claims correspond to the matters in the embodiments of the present technology which are given the same name as the disclosure-specifying matters. However, the present technology is not limited to the embodiments, and can be embodied by performing various modifications to the embodiments without departing from the spirit thereof.

Effects described herein are not necessarily limited, and may be any effect described in this disclosure.

The present technology can adopt a following configuration.

(1) A semiconductor module includes a wiring layer for data signal lines on which all data signal lines transferring a data signal are wired; a wiring layer for strobe signal lines on which all strobe signal lines transferring a strobe signal are wired in a plane connected to the wiring layer for data signal lines through vias passing through the wiring layer for data signal lines; and a chip delaying the data signal with respect to the strobe signal.

(2) The semiconductor module described in (1), in which the chip includes a data terminal provided along a side of the chip, and the data signal lines wired on the wiring layer for data signal lines are connected to the data terminal provided in the chip.

(3) The semiconductor module described in (2), in which the chip further includes a strobe terminal provided further inside than the data terminal, and the strobe signal lines wired on the wiring layer for strobe signal lines are connected to the strobe terminal provided in the chip through the vias.

(4) The semiconductor module described in (2) or (3), in which the chip further includes a wiring area of a predetermined area in which the data signal lines are wired in a position adjacent to the data terminal along a side of the chip.

(5) The semiconductor module described in any one of (1) to (4), in which the chip includes a data wiring which transfers the data signal inside the chip, and a strobe wiring whose wiring length is shorter than the data wiring, and which transfers the strobe signal inside the chip.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor module comprising:
   a via that extends through a wiring substrate from a first surface of a wiring substrate to a second surface of the wiring substrate, the second surface is opposite the first surface;
   a chip that delays a first signal before outputting the first signal onto to a first wire, the first wire on the first surface;
   a signal line on the first surface, the chip is configured output a second signal onto to the signal line; and
   a second wire on the second surface, the via electrically connects the signal line to the second wire.

2. The semiconductor module according to claim 1, further comprising:
   a terminal that electrically connects the first wire to the chip, the terminal is between the first wire and the chip.

3. The semiconductor module according to claim 1, further comprising:
   a different terminal that electrically connects the signal line to the chip, the different terminal is between the signal line and the chip.

4. The semiconductor module according to claim 3, further comprising:
   a different via that extends through the wiring substrate from the second surface to the first surface, the second wire is electrically connected to the different via.

5. The semiconductor module according to claim 4, further comprising:
   a different signal line on the first surface, the different via electrically connects the second wire to the different signal line.

6. The semiconductor module according to claim 5, wherein a different chip is configured to receive the first signal from the first wire, the different chip is configured to receive the second signal from the different signal line.

7. The semiconductor module according to claim 6, wherein the different chip is on the first surface of the wiring substrate.

8. The semiconductor module according to claim 1, wherein the chip is on the first surface of the wiring substrate.

9. The semiconductor module according to claim 1, wherein a portion of the via at the first surface is between the first wire and the signal line.

10. The semiconductor module according to claim 1, wherein data wiring inside the chip is configured to propagate the first signal within the chip and strobe wiring inside the chip is configured to propagate the second signal within the chip, the strobe wiring is shorter in length than the data wiring.

* * * * *